(12) United States Patent
Doh et al.

(10) Patent No.: US 7,330,670 B2
(45) Date of Patent: Feb. 12, 2008

(54) BOTTOM LEVEL DETECTION DEVICE FOR BURST MODE OPTICAL RECEIVER

(75) Inventors: Hee-Chan Doh, Suwon-shi (KR); Hyeon-Cheol Ki, Seoul (KR); Yun-Je Oh, Yongin-shi (KR); Gil-Yong Park, Suwon-shi (KR); Tae-Sung Park, Suwon-shi (KR); Shin-Hee Won, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 544 days.

(21) Appl. No.: 10/391,704

(22) Filed: Mar. 19, 2003

(65) Prior Publication Data
US 2003/0206744 A1    Nov. 6, 2003

(30) Foreign Application Priority Data
Apr. 19, 2002    (KR) ................. 10-2002-021652

(51) Int. Cl.
    *H04B 10/06*    (2006.01)
(52) U.S. Cl. ............................. 398/209; 398/210
(58) Field of Classification Search ........... 398/208, 398/209, 210
    See application file for complete search history.

(56) References Cited

U.S. PATENT DOCUMENTS

| | | | | |
|---|---|---|---|---|
| 6,337,573 B1 * | 1/2002 | Bonaccio et al. | ............ | 324/757 |
| 6,360,090 B1 * | 3/2002 | Holcombe et al. | .......... | 455/307 |
| 6,909,082 B2 * | 6/2005 | Doh et al. | ............ | 250/214 AG |
| 7,058,315 B2 * | 6/2006 | Brewer et al. | .............. | 398/202 |

FOREIGN PATENT DOCUMENTS

| | | |
|---|---|---|
| DE | 2905903 | 8/1980 |
| EP | 0621686 A2 | 10/1994 |
| EP | 0828359 A2 | 3/1998 |
| GB | 1568513 | 5/1980 |
| JP | 63-318805 | 12/1988 |

(Continued)

OTHER PUBLICATIONS

"Operational Amplifiers: Design and Applications" edited by Tobey et al., McGraw-Hill, 1971, pp. 90-91 and 119-127.*

(Continued)

*Primary Examiner*—Shi K Li
(74) *Attorney, Agent, or Firm*—Cha & Reiter, LLC (57) ABSTRACT

A bottom level detection device is disclosed for a burst mode optical receiver. The receiver includes a converter for converting a burst mode signal into a voltage signal and an automatic gain controller for automatically controlling a gain of the converter. The bottom level detection device detects a bottom level of an output signal from the converter and controls the automatic gain controller on the basis of the detected bottom level. The bottom level detection device includes an amplification circuit for receiving the output signal from the converter at its first input terminal and a fed-back output signal from the device at its second input terminal, respectively, and amplifying a difference between the received signals, a detector for detecting a bottom level of an output signal from the amplification circuit, and an output buffer. The detector includes an RC rectifier for receiving a power supply voltage, and a transistor having its emitter connected to an output terminal of the amplification circuit and its base and collector connected in common to the RC rectifier.

13 Claims, 11 Drawing Sheets

FOREIGN PATENT DOCUMENTS

| | | |
|---|---|---|
| JP | 11-053741 | 2/1999 |
| JP | 11-177360 | 7/1999 |

OTHER PUBLICATIONS

S. Yamashita et al., "Novel-cell AGC Technique for Burst-Mode CMOS Preamplifier with Wide Dynamic Range and High Sensitivity for ATM-PON System", Solid-State Circuit Conference 2001, Sep. 18-20, 2001.*

"Operational Amplifiers: Design and Applications" Edited by Graeme et al., McGraw-Hill, 1971, pp. 354-356.*

Takeshi Nagahori et al, "Short Guard Bit/Burst Transmission in PON System Using Fast Response Automatic Threshold Control Receiver", Sep. 1998, p. 1-5.

Charles A. Edering, "Theoretical determination o Sensitivity Penalty For Burst Mode Fiber Optic Receivers", Dec. 1, 1993, pp. 2145-2149.

* cited by examiner

FOR IN=10µA (AGC DISABLED)

BOTTOM LEVEL DETECTION DEVICE FOR BURST MODE OPTICAL RECEIVER

CLAIM OF PRIORITY

This application claims priority to an application entitled "BOTTOM LEVEL DETECTION DEVICE FOR BURST MODE OPTICAL RECEIVER", filed in the Korean Intellectual Property Office on Apr. 19, 2002 and assigned Ser. No. 2002-21652, the contents of which are hereby incorporated by reference.

BACKGROUND OF THE INVENTION

1. Field of the Invention

The present invention relates to burst mode optical receivers, and more particularly to a bottom level detection device for a burst mode optical receiver which is capable of determining whether an input signal is present and independently generating a reset signal for initialization in an inter-packet period in accordance with the determination.

2. Description of the Related Art

In order to more rapidly transfer a large amount of information to subscribers, next-generation communication techniques require an FTTH (fiber to the home) system. In such conventional FTTH systems, an optical line is installed to each home. However, a significant shortcoming of the conventional FTTH systems is that it is very costly to replacing existing subscriber networks composed of copper wires. In view of this cost, a passive optical network (PON) is considered an alternative for implementing a cost-effective FTTH system.

Figure 1:
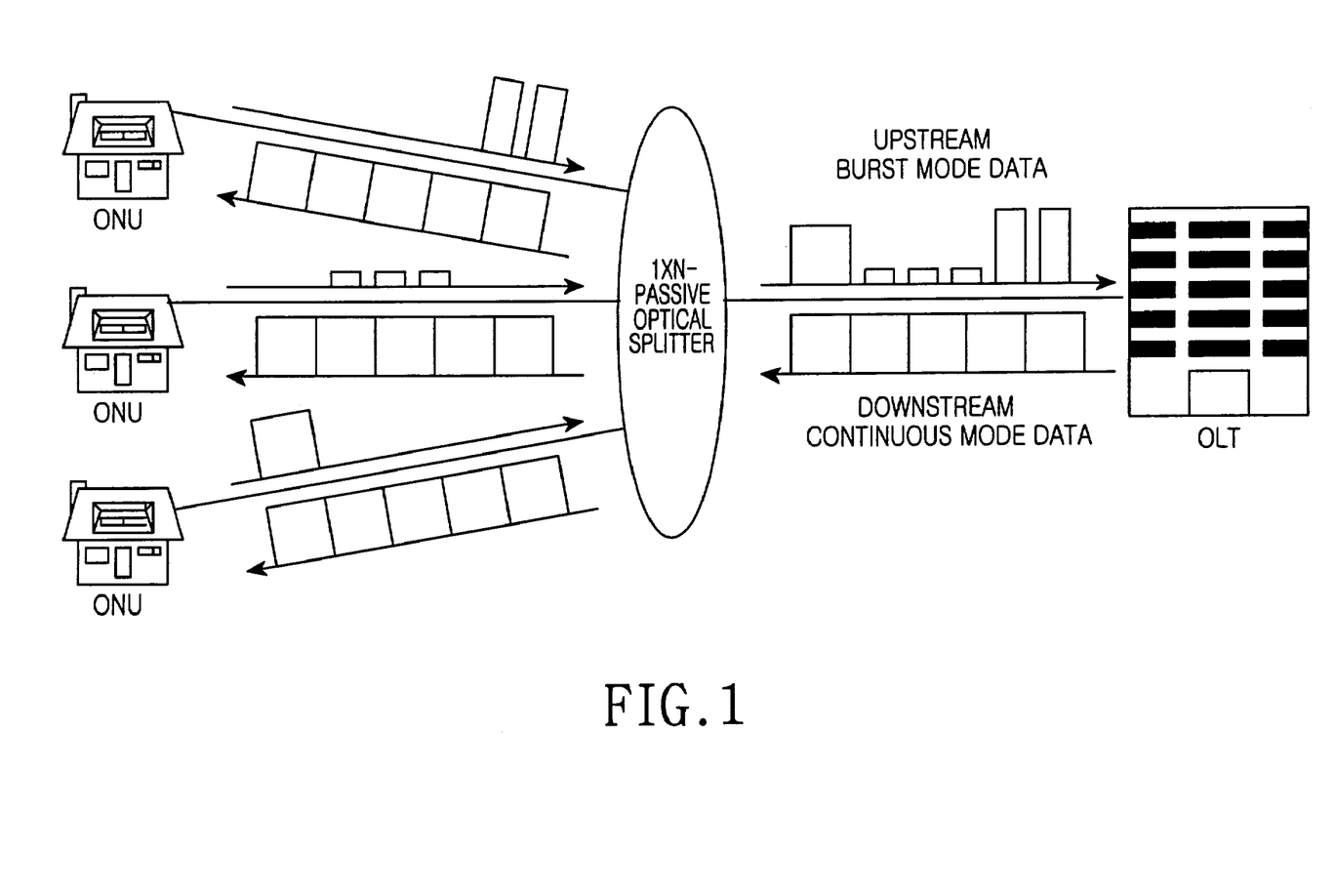
FIG. 1 is a diagram showing the construction of a passive optical network.

FIG. 1 shows diagram of a passive optical network. The passive optical network includes an OLT (Optical Line Termination), which may be located in a central office, a 1×N-passive optical splitter, and ONUs (Optical Network Units), located in a subscriber' premises.

Generally, in an optical multi-connection network, such as the passive optical network shown in FIG. 1, each node transfers a packet or data to a different node using a predetermined time slot. Such optical multi-connection networks are different from existing point-to-point links in that received data or packets are different in amplitude and phase from one another due to optical losses occurring on different transfer paths. The data is typically called burst mode data. In other words, a plurality of subscribers utilize one optical line in a time division multiplex manner, but a receiver, i.e., the OLT, on the line recognizes that each subscriber sends data at a random time. The incoming data packets are not constant in amplitude due to differences among paths to respective subscribers.

A conventional burst mode optical receiver is known that receives burst mode data which is different in amplitude and phase on a packet basis and restores the received burst mode data such that their packets are the same in amplitude and phase. Such burst mode optical receivers remove a DC blocking capacitor used in an AC coupling scheme of a general receiver to prevent losses of burst mode data resulting from charging/discharging times of the capacitor. The burst mode optical receiver also functions to extract a detection threshold as a reference signal for data detection from each received burst mode packet. The burst mode optical receiver further functions to restore data by amplifying it symmetrically with respect to the extracted detection threshold.

Figure 2:
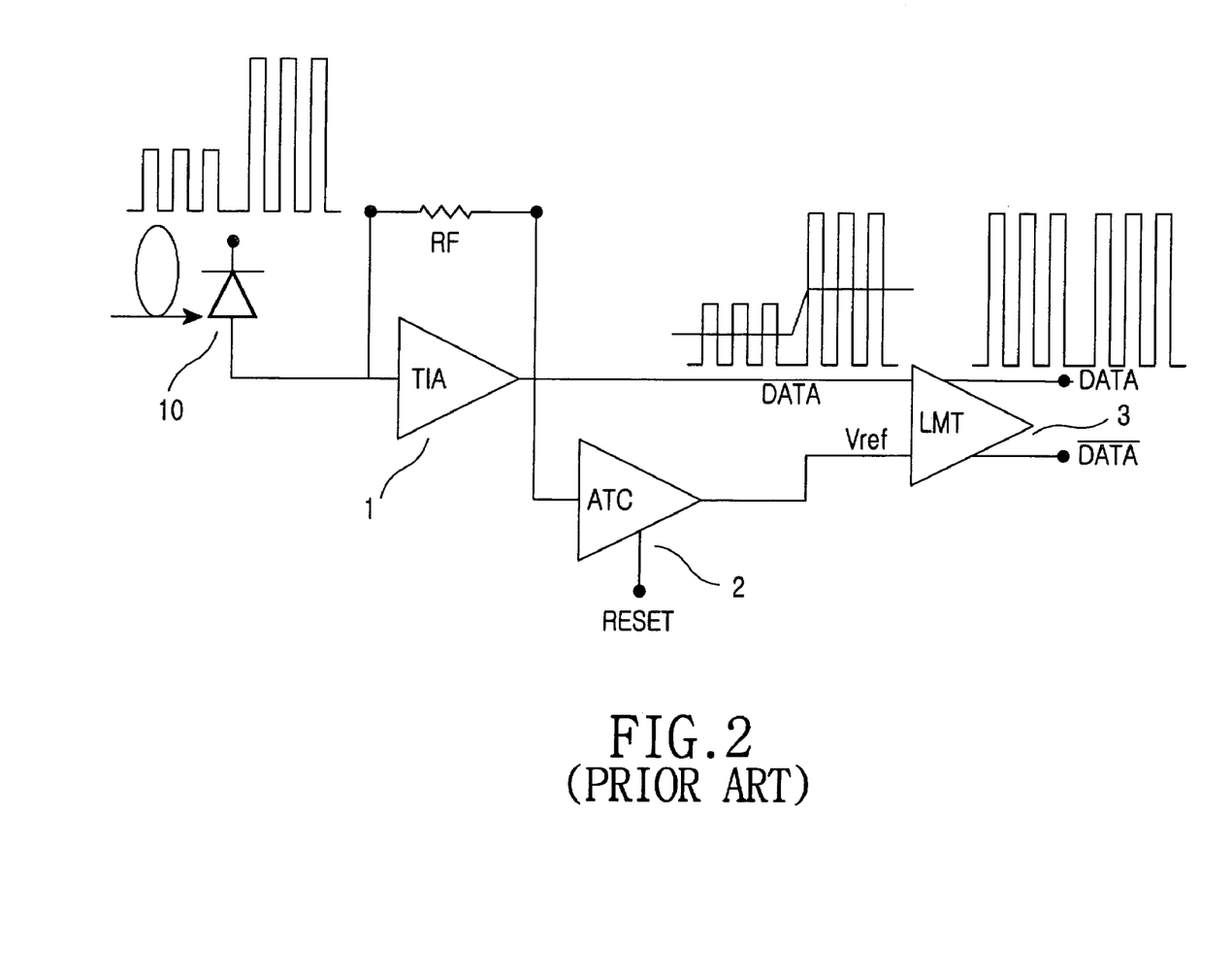
FIG. 2 is a schematic showing the construction of a conventional burst mode optical receiver.

FIG. 2 schematically shows the construction of a conventional burst mode optical receiver. The conventional burst mode optical receiver includes an optical detector 10, a preamplifier or transimpedance amplifier (TIA) 1, an automatic threshold controller (ATC) 2 and a limiting amplifier 3.

The optical detector 10 acts to convert an input optical signal into a current signal.

The TIA 1 functions to convert the current signal converted by the optical detector 10 into a voltage signal. A transimpedance, which is an input current-to-output voltage ratio, is determined by a feedback resistor Rf connected between an input terminal of the TIA 1 and an output terminal thereof.

In the burst mode optical receiver, the TIA 1 is used in a DC coupling manner. An input signal is amplified by the TIA 1 and then branches off into two parts. One part is input to the ATC 2, which then extracts a detection threshold of a received packet therefrom.

The other part is DC-coupled and input to the limiting amplifier 3. The detection threshold, which is automatically changed according to the amplitude of the corresponding packet, is input to Vref of the limiting amplifier 3. The limiting amplifier 3 functions to amplify signals of different amplitudes input thereto to restore them to signals having a constant amplitude.

However, the above-mentioned conventional burst mode optical receiver has a disadvantage in that a reset signal for initialization in an inter-packet period is input through the use of an external additional circuit. This makes it difficult to accurately control a reset timing. In addition, the use of the external additional circuit makes the receiver circuitry complicated and increases the size of the receiver parts.

Accordingly, there is a need in the art for an improved burst mode optical receiver.

SUMMARY OF THE INVENTION

One object of the present invention is to provide a bottom level detection device for a burst mode optical receiver that is capable of determining whether an input signal is present and independently generating an initial reset signal in accordance with the determined result.

It is another object of the present invention is to provide a bottom level detection device for a giga-class burst mode optical receiver which is capable of receiving burst mode data which is different in amplitude and phase on a packet basis and restoring the received burst mode data accurately and rapidly.

One embodiment of the present invention is directed to a bottom level detection device for a burst mode optical receiver. The receiver includes a converter for converting a burst mode signal into a voltage signal and an automatic gain controller for automatically controlling again of the converter. The bottom level detection device detects a bottom level of an output signal from the converter and controls the automatic gain controller on the basis of the detected bottom level. The device includes differential amplification means for receiving the output signal from the converter at its first input terminal and a fed-back output signal from the device at its second input terminal, respectively, and amplifying a difference between the received signals, detection means for detecting a bottom level of an output signal from the differential amplification means, and output buffering means. The detection means includes an RC rectifier for receiving a power supply voltage, and a transistor having its emitter connected to an output terminal of the differential amplification means and its base and collector connected in common to the RC rectifier.

Preferably, the differential amplification means may include at least two differential amplifiers connected in a multi-stage manner; and a plurality of buffering transistors connected to the differential amplifiers.

BRIEF DESCRIPTION OF THE DRAWINGS

The above features and other advantages of the present invention will be more clearly understood from the following detailed description taken in conjunction with the accompanying drawings, in which.

DETAILED DESCRIPTION OF THE PREFERRED EMBODIMENTS

Preferred embodiments of the present invention will be described in detail with reference to the annexed drawings. In the drawings, the same or similar elements are denoted by the same reference numerals even though they are depicted in different drawings. For the purposes of clarity and simplicity, a detailed description of known functions and configurations incorporated herein will be omitted as it may make obscure the subject matter of the present invention.

Figure 3:
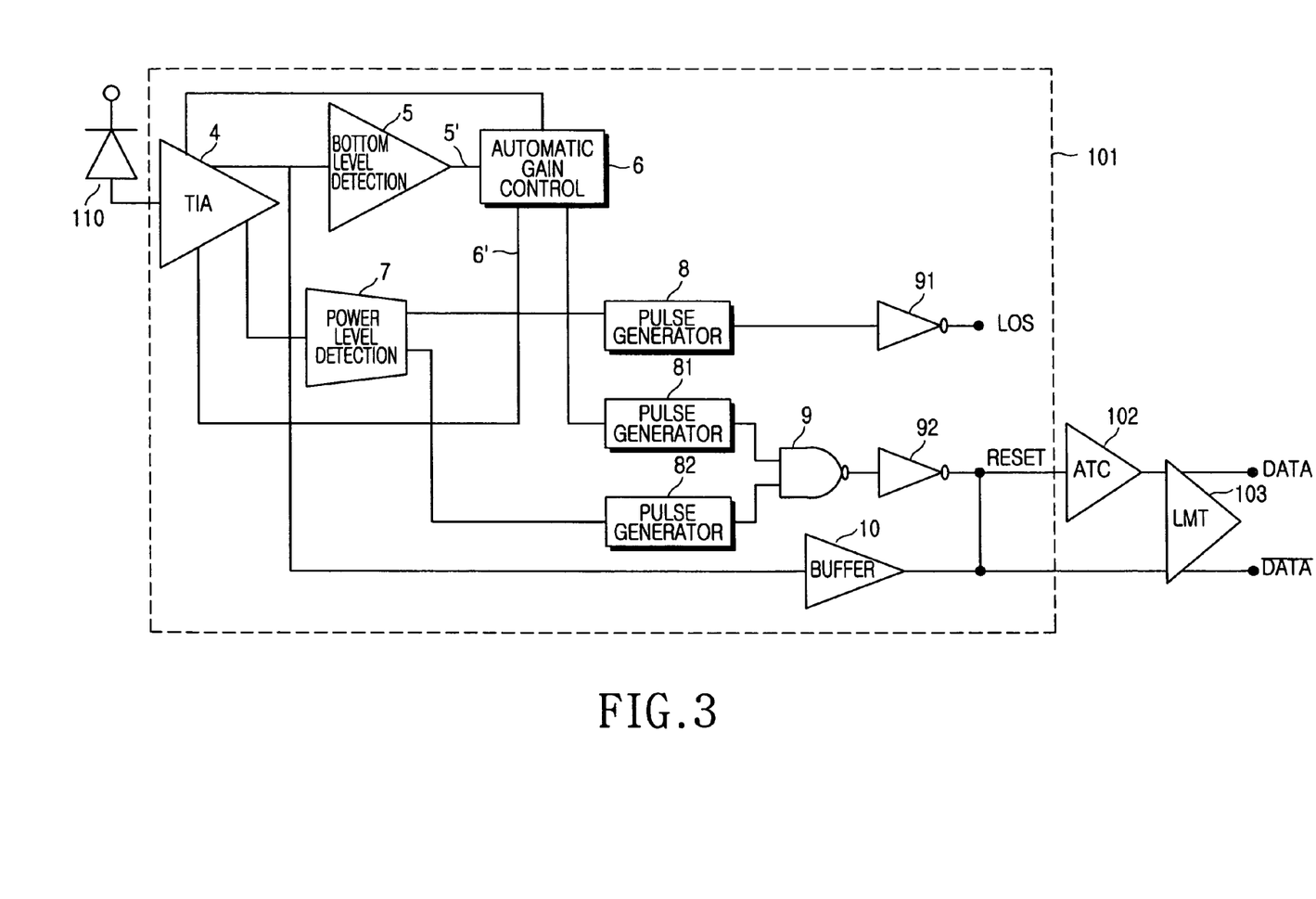
FIG. 3 is a schematic showing the construction of a burst mode optical receiver in accordance with aspects of the present invention.

FIG. 3 shows the construction of a burst mode optical receiver in accordance with aspects of the present invention. The burst mode optical receiver includes an optical detector 110, a preamplifier 101, an ATC 102 and a limiting amplifier 103.

The preamplifier 101 includes a TIA 4 for determining the gain and bandwidth of the preamplifier 101, a bottom level detection device 5 for detecting a bottom level of an output signal from the TIA 4, an automatic gain controller (AGC) 6 for generating an automatic gain control signal on the basis of the bottom level detected by the bottom level detection device 5 to automatically control the gain of the TIA 4, and a power level detector 7 for detecting a power level of the output signal from the TIA 4. The preamplifier 101 further includes a plurality of pulse generators 8, 81 and 82, a NAND gate 9 and an output buffer 10 for the TIA 4.

The TIA 4 converts an output current signal from the optical detector 110 into a voltage signal and provides the converted voltage signal to the bottom level detection device 5.

Figure 4:
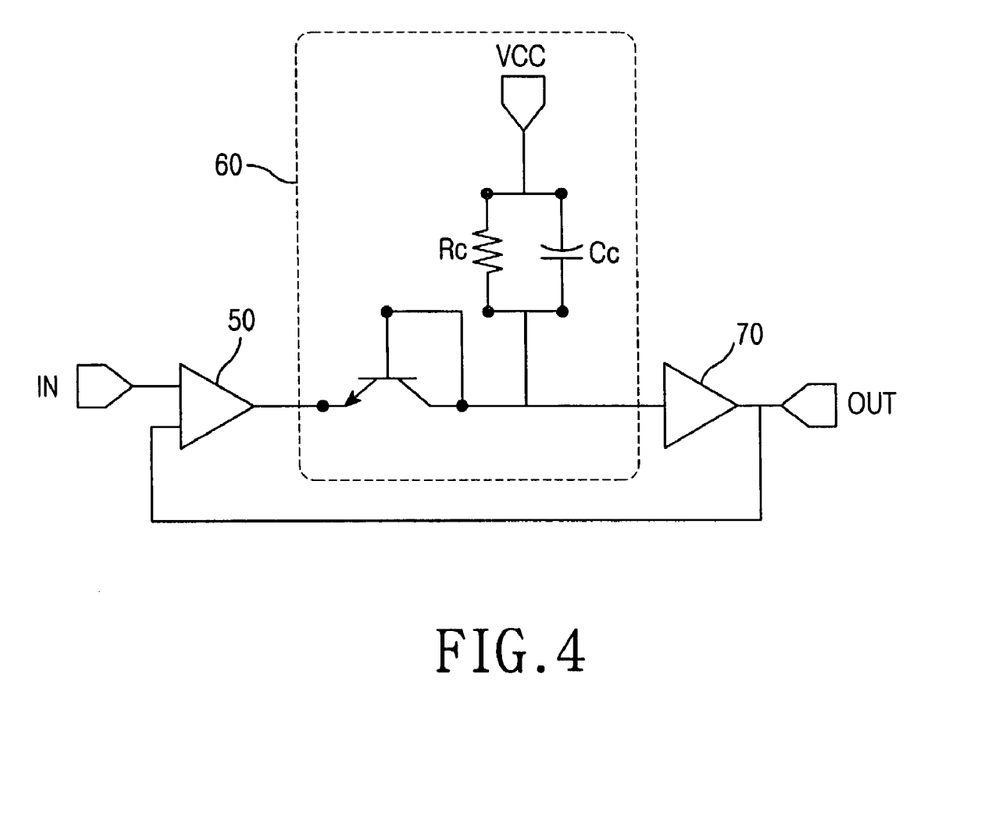
FIG. 4 is a schematic of a bottom level detection device in accordance with aspects of the present invention.
Figure 5:
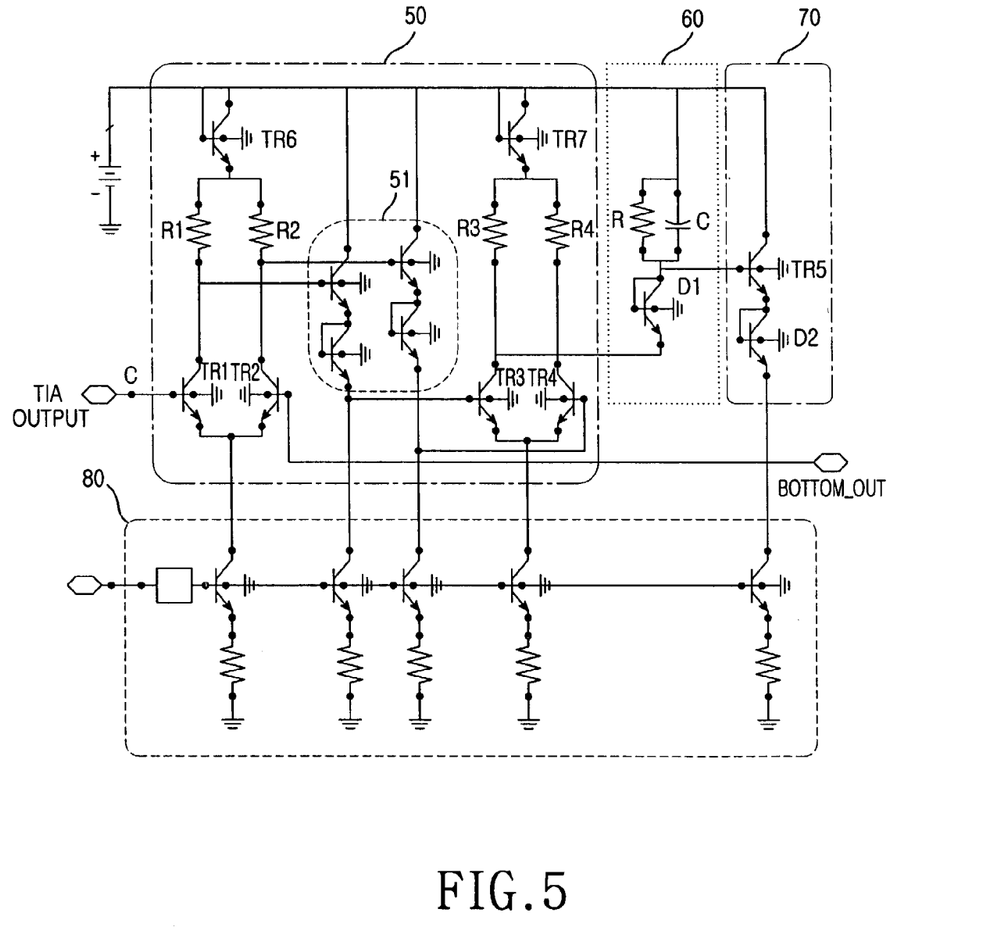
FIG. 5 is a circuit diagram of the bottom level detection device of FIG. 4.

FIG. 4 shows the structure of the bottom level detection device 5 and FIG. 5 is a detailed circuit diagram of FIG. 4.

Referring to FIG. 4, the bottom level detection device 5 basically includes an amplification circuit 50 for amplifying an input signal, a detector 60 for detecting a bottom level of the amplified signal, an output buffer 70, and a current source 80 (shown in FIG. 5).

Referring to FIG. 5, the amplification circuit 50 includes a two-stage amplifier including of first and second differential amplifiers, and a two-stage buffer 51 connected between the first differential amplifier and the second differential amplifier of the two-stage amplifier. The first differential amplifier is provided with resistors R1 and R2 and transistors TR1 and TR2, and the second differential amplifier is provided with resistors R3 and R4 and transistors TR3 and TR4.

In this embodiment, the reason the two-stage amplifier is used is because when the original signal is directly input to the detector 60 in the bottom level detection device 5 and a bottom level thereof is then detected by the detector 60, a voltage offset is generated due to a forward voltage of a diode. This voltage offset, which is about 800 mV, makes it impossible to accurately detect the signal bottom level. In order to overcome this problem, the voltage offset is reduced by the gain of the amplifier by amplifying the signal, detecting the bottom level thereof and feeding it back. For example, if the gain of the amplifier is 40, the voltage offset is 800/40 =20 mV. Theoretically, the offset is advantageously reduced by increasing the gain of the amplifier. Nevertheless, a proper control is required because a multi-stage amplifier has a high possibility of circuit oscillation.

The two-stage buffer is used to meet an input voltage condition of the second amplifier.

The detector 60, which is provided with a diode D1 and an RC rectifier, receives a signal at a node a, or the signal amplified by the amplification circuit 50. If the voltage level of the signal is lowered negatively, then the diode D1 is forward biased to charge a capacitor C. Alternatively, if the signal voltage level is raised positively, then the diode D1 is reversely biased to enter a cut-off state. This causes the capacitor C to discharge. On this principle, the signal bottom level is maintained. If the capacitor is increased in capacitance, the offset can be reduced, but there is a disadvantage in that a larger amount of time is required in detecting the bottom level. In the case where the capacitor is reduced in capacitance, the bottom level detection time is advantageously shortened, whereas the offset is increased. For this reason, it is necessary to appropriately adjust an RC time constant.

The buffer 70 is connected to the output of the detector 60 in order to feed a signal detected by the detector 60 back to the amplification circuit 50. The buffer 70 is provided with a transistor TR5 for preventing a reference voltage from varying during consecutive data input and blocking an unnecessary discharging path, and a level shifting diode D2 for adjusting the level of an output voltage.

With the above-described construction and operation, the bottom level detection device 5 always detects a bottom level of the output signal from the TIA 4 irrespective of whether the output signal from the TIA 4 is high or low in level. The use of the detected bottom level makes it possible to accurately determine whether an input signal is present. Provided that no signal bottom level is detected, an AGC control signal to be described later will be generated to detect a power level of the input signal. in contrast, while a peak level, detected by a commonly-used peak detector, has no particular problem when an input signal is high in level, it cannot provide accurate information regarding the actual voltage level when the input signal is low in level. This results in difficulty in determining whether the input signal is present.

The use of the bottom level detected by the bottom level detection device 5 further enables the accurate generation of an AGC signal and the accurate determination of an inter-packet period, so that an output voltage can always be maintained at a proper level.

Figure 6:
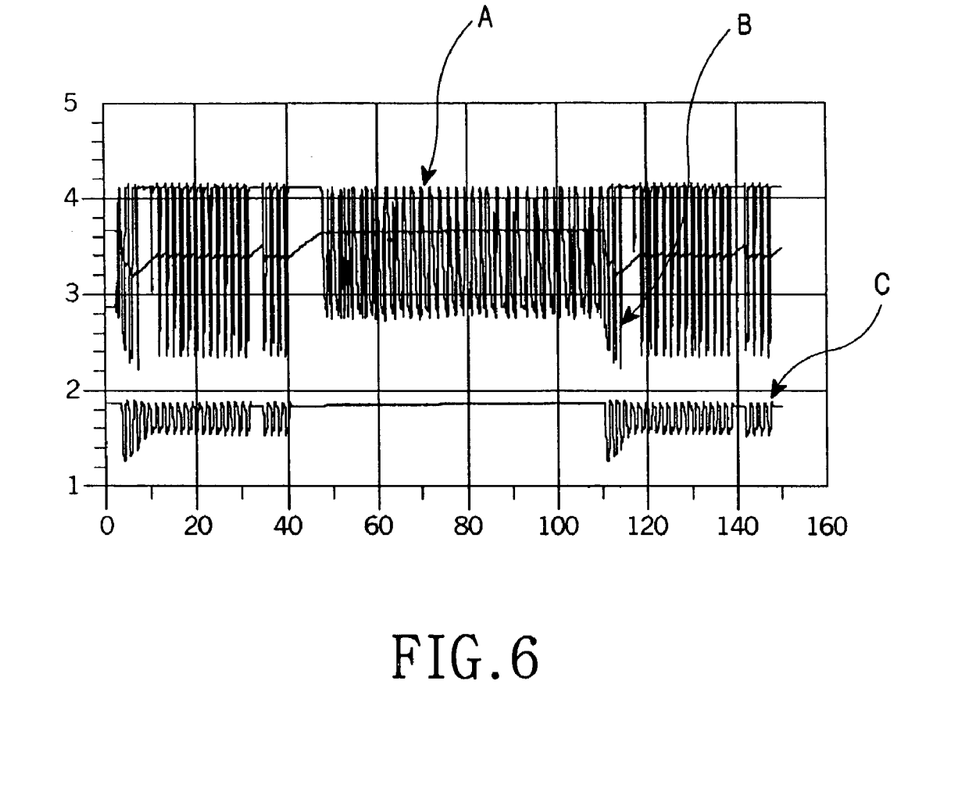
FIG. 6 is a waveform diagram illustrating voltage levels at nodes a, b and c in FIG. 5.

FIG. 6 is a waveform diagram illustrating voltage levels at the nodes a, b and c in FIG. 5, wherein the axis of ordinate represents a voltage level and the axis of abscissa represents time (nsec).

With reference to FIGS. 5 and 6, the reference character A denotes an output characteristic at an output terminal (the node a) of the amplification circuit 50, or an output terminal of the two-stage differential amplifier, B denotes a constant voltage characteristic at an output terminal (the node b) of the detector 60, or an output terminal of the diode and RC rectification filter, and C denotes a voltage level Bottom_In at an output terminal (the node c) of the TIA.

Figure 7:
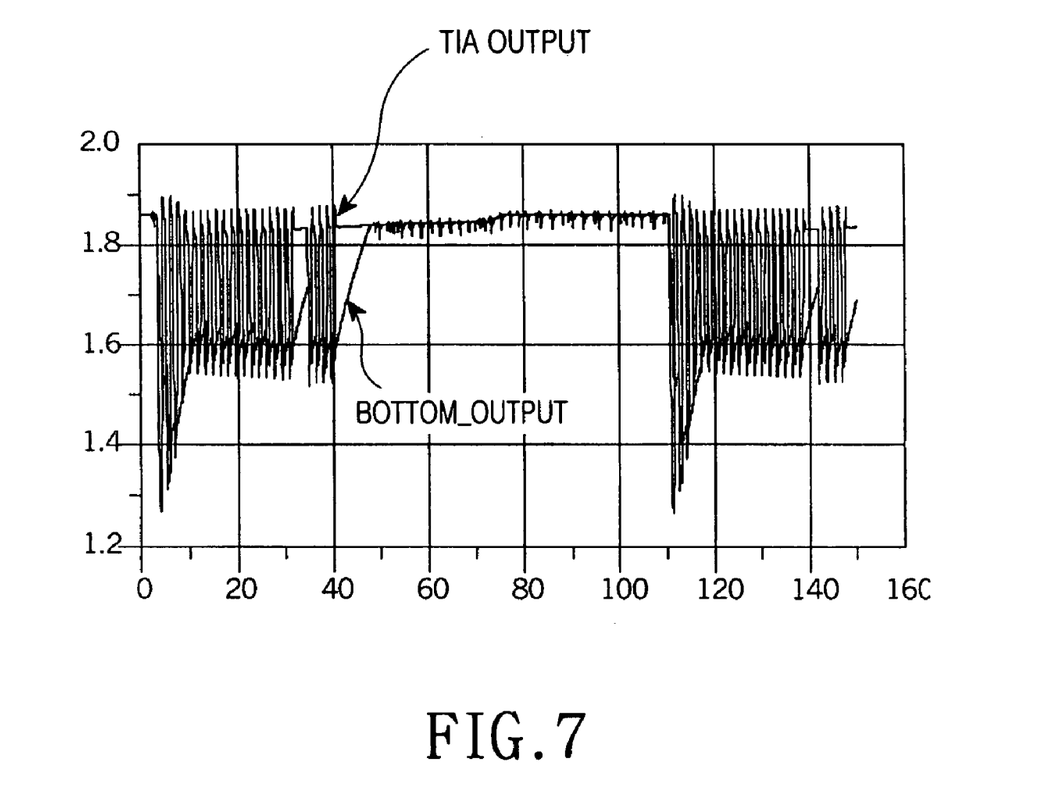
FIG. 7 is a waveform diagram illustrating an input signal-to-output signal characteristic of the bottom level detection device in accordance with aspects of the present invention.

FIG. 7 is a waveform diagram illustrating an input signal-to-output signal characteristic of the bottom level detection device in accordance with aspects of the present invention. As noted above, the bottom level of the TIA output signal is detected irrespective of whether the TIA output signal is high or low in level.

Referring again to FIG. 3, the AGC 6 functions to generate an AGC control signal 6' on the basis of the bottom level detected by the bottom level detection device 5 to adjust the gain of the TIA 4.

The output current signal from the optical detector 110 generally has current variations within the range of −31 dBm to −16 dBm. Provided that a certain current variation of the output signal from the optical detector 110 is beyond this range, the output signal from the TIA 4 will be subject to considerable distortion. In this regard, the AGC 6 must be operated to compensate for distortion in the output signal from the TIA 4.

To facilitate this, according to a preferred embodiment of the present invention, the AGC 6 is configured to start its control operation by generating the AGC control signal 6' at the moment that the output signal from the TIA 4 begins to be distorted, namely, the bottom level thereof turns off an output buffering transistor for the TIA 4.

The AGC 6 may preferably include a signal presence determination unit for analyzing the bottom level detected by the bottom level detection device 5 to determine whether an input signal is present. Upon determining, from the detected bottom level, that an input signal is present, the signal presence determination unit generates a signal presence indication signal. However, if no input signal is determined to be present, then the signal presence determination unit generates a signal absence indication signal, which is a packet termination indication signal. This packet termination indication signal resets the AGC signal 6' so that the AGC voltage level can be re-set at the beginning of a next packet.

This prevents the output signal from the TIA 4 from becoming too low in level due to a too low operating reference level of the AGC 6. The AGC 6 can also be prevented from being operated after the output signal from the TIA 4 is distorted, due to an excessively high operating reference level of the AGC 6.

The AGC 6 may also include a peak detector for setting and maintaining an initial AGC signal at a collector of an input transistor to a peak level to minimize a jitter resulting from a variation in the actual AGC control signal 6'.

The power level detector 7 detects a power level of the output signal from the TIA 4 to determine whether an input signal is present and whether an inter-packet period is present. The power level detector 7 provides its two output signals, one of which is passed through the pulse generator 8 and an inverter 91 for generation of an LOS signal indicative of no signal presence and the other of which is applied to an input terminal of a reset signal generation circuit.

The power level detector 7 may preferably include a capacitor for coupling the output signal from the TIA 4 to detect the power level thereof regardless of a DC level of an input signal.

The pulse generator 8 generates a pulse signal in response to the first output signal from the power level detector 7 to indicate packet start, packet termination and an inter-packet period. The pulse signal generated by the pulse generator 8 is inverted by the inverter 91 and then output as the LOS signal. The pulse generator 81 generates a pulse signal in response to the output signal from the AGC 6 and the pulse generator 82 generates a pulse signal in response to the second output signal from the power level detector 7. The pulse signals generated by the pulse generators 81 and 82 are NANDed by the NAND gate 9, inverted by an inverter 92 and then output as the reset signal.

The output buffer 10 is adapted to regulate a DC level of the final output signal of the preamplifier 101 in consideration of the input of the final output signal to the ATC 102 and limiting amplifier 103 downstream of the preamplifier 101.

Figure 8A:
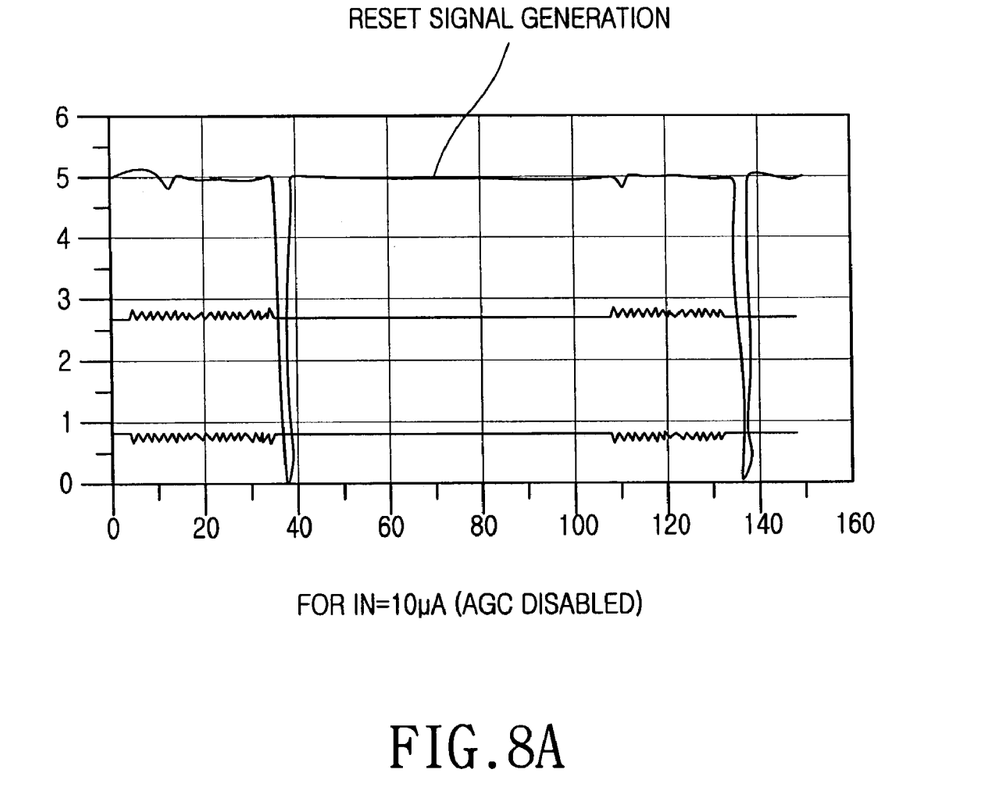
FIGS. 8A and 8B are output waveform diagrams of the burst mode optical receiver according an embodiment of the present invention, illustrating operation characteristics of a preamplifier based on small input current.
Figure 9A:
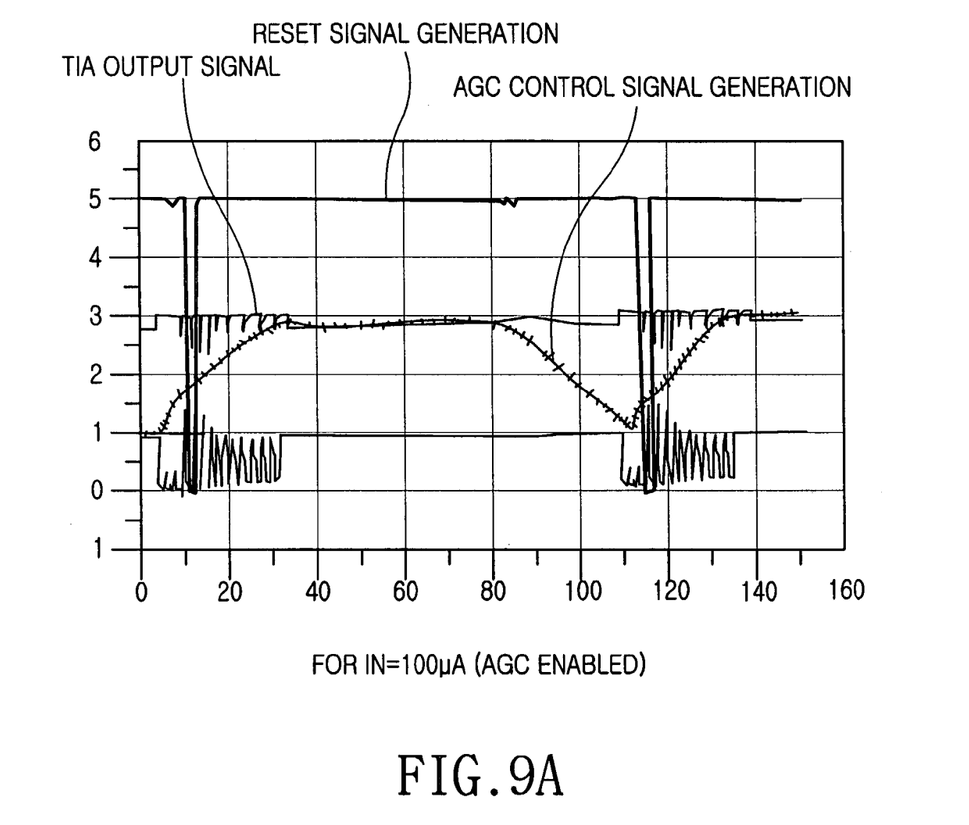
FIGS. 9A and 9B are output waveform diagrams of the burst mode optical receiver according an embodiment of the present invention, illustrating operation characteristics of the preamplifier based on large input current.

FIGS. 8A and 9A are output waveform diagrams of the burst mode optical receiver according to embodiments of the present invention. This waveform diagram illustrates operation characteristics of the preamplifier 101 when an input current is 10 µA and 100 µA, respectively. The axis of ordinate represents a voltage level and the axis of abscissa represents time (nsec).

It can be seen from FIG. 8A that the AGC 6 generates no control signal when the input current is small (for example, 10 µA). However, when the input current is of a certain large level (for example, 100 µA), the AGC 6 generates a control signal (see FIG. 9A).

Figure 8B:
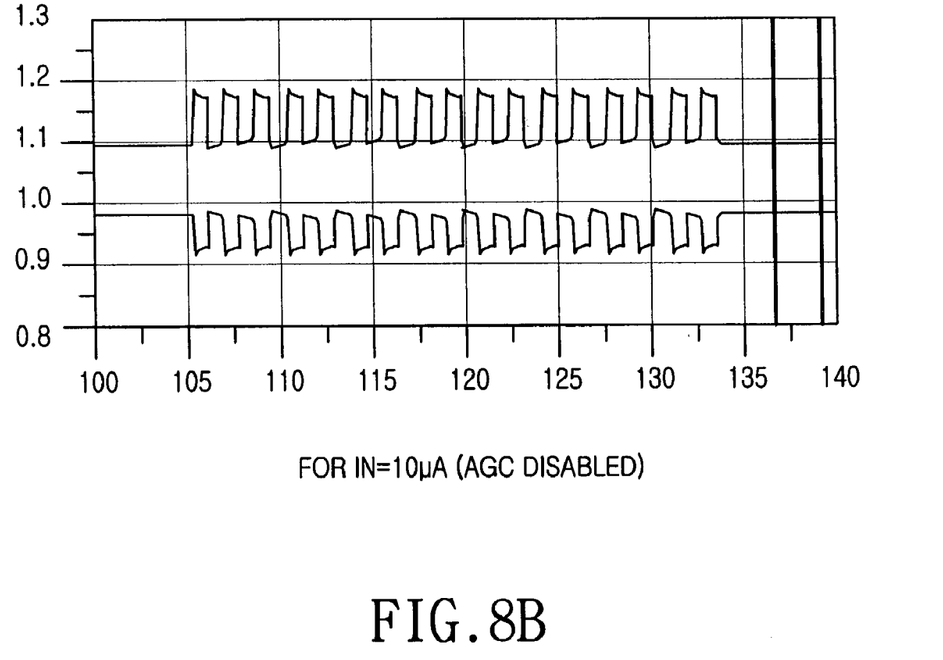
Figure 9B:
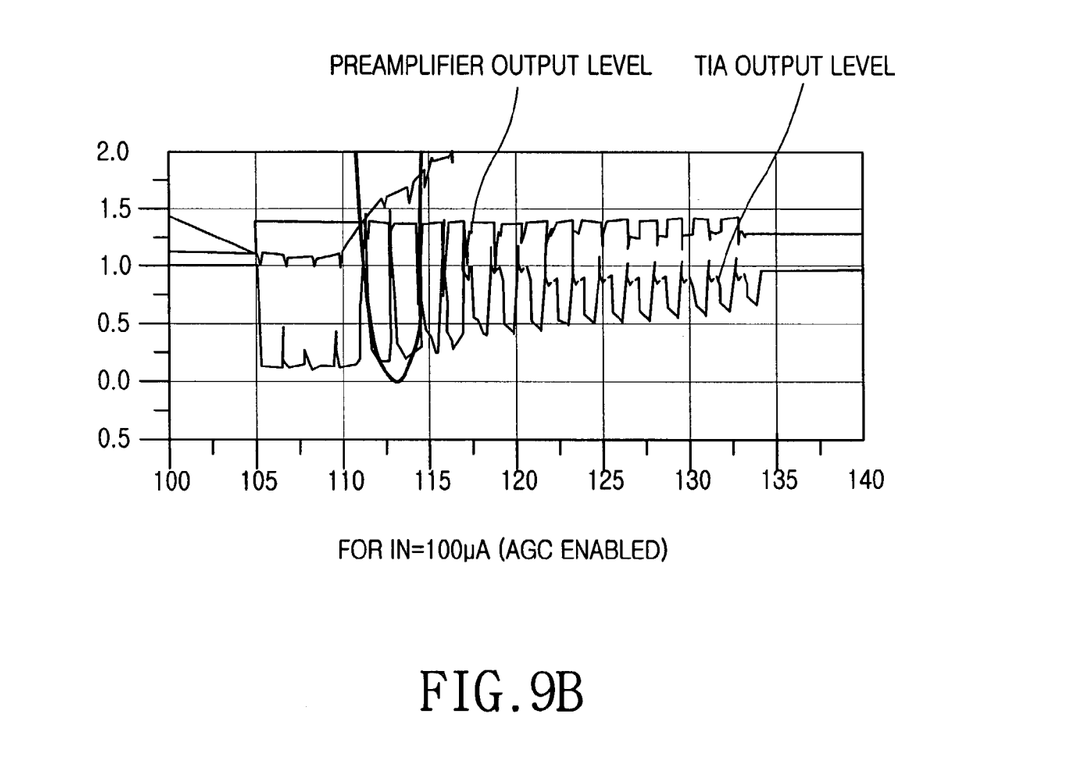

FIGS. 8B and 9B are enlarged views of FIGS. 8A and 9A, respectively. A value of the preamplifier output level −1.6V is shown so that the output level can be depicted in one graph.

As apparent from the above description, the present invention provides a bottom level detection device for a burst mode optical receiver that is capable of independently generating a reset signal for initialization in an inter-packet period. The application of the present bottom level detection device to the burst mode optical receiver can remove a need for an additional circuit for generation of the reset signal, resulting in a reduction in the size of the receiver parts.

Further, the bottom level detection device can detect a bottom level of an input signal, so that the receiver can accurately recognize information regarding an actual voltage level and, in turn, accurately determine whether the input signal is present, even though the input signal is low in voltage level.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A burst mode optical receiver comprising a bottom level detection device, a converter configured to convert a burst mode signal into a voltage signal and an automatic gain controller configured to automatically control a gain of the converter, said bottom level detection device being configured to detect a bottom level of an output signal from the converter and configured to control the automatic gain controller on the basis of the detected bottom level, said bottom level detection device comprising:

a differential amplification means configured to receive the output signal from the converter at its first input terminal and a fed-back output signal from said bottom level detection device at its second input terminal, respectively, and configured to amplify a difference between the received signals;

a detection means configured to detect a bottom level of an output signal from said differential amplification means; and an output buffering means being configured to output the fed-back output signal from said bottom level detection device, a power level detector that is configured to detect a power level of the voltage signal output from said differential amplifications means, said power level detector being configured to determine whether an input signal to the receiver is present and whether an inter-packet period is present;

wherein said detection means includes an RC rectifier that is configured to receive a power supply voltage, and a transistor having its emitter connected to an output terminal of said differential amplification means and its base and collector connected in common to said RC rectifier; and reset means for providing an independently generated initial reset signal, said reset means comprising a plurality of pulse generators driven by an output of said power level detector and said detection means for detecting a bottom level of the output signal from said differential amplification means.

2. The burst mode optical receiver as claimed in claim 1, wherein said differential amplification means includes:

at least two differential amplifiers connected in a multi-stage manner; and a plurality of buffering transistors connected to said differential amplifiers.

3. The burst mode optical receiver as claimed in claim 1, wherein said output buffering means includes at least one transistor and at least one level shifting diode connected thereto.

4. A burst mode optical receiver comprising a bottom level detection device, the bottom level detection device comprising:

a differential amplifying section arranged to receive a voltage signal at a first input terminal and a fed-back output signal at a second input terminal and amplifying a difference between the received signals;

a detector being connected to an output terminal of the differential amplifier and being configured to detect a bottom level of en output signal of the differential amplifier, the detector including an RC rectifier and a transistor, the transistor having an emitter that is connected to the output terminal of the differential amplifier and a base and collector connected in common to the RC rectifier; and an output buffer being configured to output the fed-back output signal from said bottom level detection device;

a power level detector that is configured to detect a power level of the voltage signal output from said differential amplifying section and to determine whether an input signal to the receiver is present and whether an inter-packet period is present;

reset means for providing an independently generated initial reset signal, said reset means comprising a plurality of pulse generators driven by an output of said power level detector and said detection means for detecting a bottom level of the output signal from said differential amplification means.

5. The burst mode optical receiver as claimed in claim 4, wherein the differential amplifying section includes at least two differential amplifiers connected In a multi-stage manner, and a plurality of buffering transistors connected to the differential amplifiers.

6. The burst mode optical receiver as claimed in claim 4, wherein the output buffer includes at least one transistor and at least one level shifting diode connected thereto.

7. The burst mode optical receiver as claimed in claim 4 further comprising a converter configured to convert a burst mode signal into the voltage signal and an automatic gain controller (AGO) configured to automatically control a gain of the converter.

8. The burst mode optical receiver as claimed in claim 7, wherein the bottom level detection device is being configured to detect a bottom level of the output signal from the converter and to control the automatic gain controller on the basis of the detected bottom level.

9. The burst mode optical receiver as claimed in claim 7, wherein the bottom level of the output signal is detected irrespective of whether the output signal has a high or low in voltage level.

10. The burst mode optical receiver as claimed in claim 7, wherein the AGC includes a signal presence determination unit that is configured to analyze the bottom level detected by the bottom level detection device and that is configured to determine whether an input signal to the receiver is present.

11. The burst mode optical receiver as claimed in claim 7, wherein the AGC is configured to start a control operation by generating an AGC control signal to the converter when the voltage signal from the convener begins to distort.

12. A burst mode optical receiver comprising a bottom level detection device, the bottom level detection device comprising: p1 a differential amplifying section arranged to receive a voltage signal at a first input terminal and a fed-back output signal at a second input terminal and amplifying a difference between the received signals;

a detector being connected to an output terminal of the differential amplifier and being configured to detect a bottom level of an output signal of the differential amplifier, the detector including an RC rectifier and a transistor, the transistor having an emitter that is connected to the output terminal of the differential amplifier and a base and collector connected in common to the RC rectifier; and an output buffer being configured to output the fed-back output signal from said bottom level detection device;

a converter configured to convert a burst mode signal into the voltage signal and an automatic cain controller (AGO configured to automatically control a gain of the convener;

wherein the AGC includes a signal presence determination unit that is configured to analyze the bottom level detected by the bottom level detection device and that is configured to determine whether an input signal to the receiver is present;

wherein the receiver also includes a power level detector that is configured to detect a power level of the voltage signal and that is configured to determine whether an input signal to the receiver is present and whether an inter-packet period is present; and a first and second pulse generator, the first pulse generator being configured to generate a pulse signal in response to an output signal front the AGC and the second pulse generator being configured to generate a pulse signal in response to an output signal front the power level detector, wherein the generated pulse signals are used to generate a reset signal.

13. The burst mode optical receiver as claimed in claim 12, wherein the reset signal is used for initialization in an inter-packet period.

\* \* \* \* \*